(12) United States Patent
Chong

(10) Patent No.: US 11,984,541 B2
(45) Date of Patent: May 14, 2024

(54) LIGHT EMITTING DIODE STRUCTURE HAVING RESONANT CAVITY AND METHOD FOR MANUFACTURING THE SAME

(71) Applicant: Raysolve Optoelectronics (Suzhou) Company Limited, Suzhou (CN)

(72) Inventor: Wing Cheung Chong, Hong Kong (CN)

(73) Assignee: RAYSOLVE OPTOELECTRONICS (SUZHOU) COMPANY LIMITED, Suzhou (CN)

( * ) Notice: Subject to any disclaimer, the term of this patent is extended or adjusted under 35 U.S.C. 154(b) by 418 days.

(21) Appl. No.: 17/209,658

(22) Filed: Mar. 23, 2021

(65) Prior Publication Data

US 2021/0320229 A1    Oct. 14, 2021

Related U.S. Application Data

(60) Provisional application No. 63/009,995, filed on Apr. 14, 2020.

(51) Int. Cl.
*H01L 33/46* (2010.01)
*H01L 33/00* (2010.01)
*H01L 33/06* (2010.01)

(52) U.S. Cl.
CPC ........ *H01L 33/465* (2013.01); *H01L 33/0075* (2013.01); *H01L 33/06* (2013.01); *H01L 2933/0058* (2013.01)

(58) Field of Classification Search
CPC . H01L 33/465; H01L 33/0075; H01L 33/007; H01L 33/06; H01L 33/10; H01L 33/105; H01L 25/0753
See application file for complete search history.

(56) References Cited

U.S. PATENT DOCUMENTS

| | | |
|---|---|---|
| 2005/0247950 A1 | 11/2005 | Nakamura et al. |
| 2013/0147689 A1 | 6/2013 | Liu et al. |
| 2014/0159007 A1 | 6/2014 | Song et al. |
| 2014/0332779 A1 | 11/2014 | Lin |
| 2019/0067906 A1* | 2/2019 | Yuen .................. H01S 5/18311 |

FOREIGN PATENT DOCUMENTS

| | | |
|---|---|---|
| CN | 105098094 A | 11/2015 |
| CN | 110379938 A | 10/2019 |
| JP | 6318893 A | 8/1988 |
| JP | 200641284 A | 2/2006 |

(Continued)

OTHER PUBLICATIONS

International Search Report in corresponding PCT Application No. PCT/CN2021/086408 dated Jul. 8, 2021 (4 pages).

(Continued)

*Primary Examiner* — Latanya N Crawford Eason
(74) *Attorney, Agent, or Firm* — Bayes PLLC

(57) ABSTRACT

A LED structure includes a substrate, a LED unit formed on the substrate, a first reflector layer formed between the substrate and the LED unit, and a second reflector layer formed on the LED unit. A common anode layer of the LED unit is formed on the first reflector layer. The first reflector layer, the LED unit and the second reflector layer are configured to collectively provide a resonant cavity.

16 Claims, 16 Drawing Sheets

(56) References Cited

FOREIGN PATENT DOCUMENTS

| JP | 2007294725 | A  | 11/2007 |
|----|------------|----|---------|
| JP | 201792460  | A  | 5/2017  |
| JP | 202021964  | A  | 2/2020  |
| WO | 2019125306 | A1 | 6/2019  |

OTHER PUBLICATIONS

Yeh et al., GaN-Based Resonant-Cavity LEDs Featuring a Si-Diffusion-Defined Current Blocking Layer; IEEE Photonics Technology Letters, vol. 26, No. 24 (Dec. 15, 2014) (4 pages).

Zhang et al., A Resonant-Cavity Blue-Violet Light-Emitting Diode With Conductive Nanoporous Distributed Bragg Reflector; Phys. Status Solidi A 214, No. 8, 1600866 (2017) (3 pages).

Huang et al., Chapter 9; Fabrication and Characterization of Green Resonant-Cavity Light-Emitting Diodes Prepared by Wafer Transfer Technologies; III-Nitride Materials, Devices and Nano-Structures Downloaded from www.worldscientific.com by Nanyang Technological University on Oct. 10, 2017 (37 pages).

Office Action in related Japanese Application No. 2022-555665 dated Jul. 25, 2023 (5 pages).

Office Action in related Japanese Application No. 2022-555665 dated Jan. 18, 2024 (11 pages).

\* cited by examiner

700

```
┌─────────────────────────────────────────────────────────────────────┐
│ Forming a first doping type semiconductor layer, a multiple quantum │─── 702
│ well (MQW) layer, and a second doping type semiconductor layer on  │
│ a second substrate                                                  │
└─────────────────────────────────────────────────────────────────────┘
                                   │
                                   ▼
┌─────────────────────────────────────────────────────────────────────┐
│ Forming a first reflector layer on the first doping type            │─── 704
│ semiconductor layer                                                 │
└─────────────────────────────────────────────────────────────────────┘
                                   │
                                   ▼
┌─────────────────────────────────────────────────────────────────────┐
│ Flipping over the second substrate and bonding the first reflector  │─── 706
│ layer, the first doping type semiconductor layer, the MQW layer,    │
│ and the second doping type semiconductor layer on a first substrate │
└─────────────────────────────────────────────────────────────────────┘
                                   │
                                   ▼
┌─────────────────────────────────────────────────────────────────────┐
│ Removing the second substrate                                       │─── 708
└─────────────────────────────────────────────────────────────────────┘
                                   │
                                   ▼
┌─────────────────────────────────────────────────────────────────────┐
│ Performing an implantation operation to form an ion-implanted       │─── 710
│ material in the second doping type semiconductor layer              │
└─────────────────────────────────────────────────────────────────────┘
                                   │
                                   ▼
┌─────────────────────────────────────────────────────────────────────┐
│ Forming a passivation layer having at least one opening on the      │─── 712
│ second doping type semiconductor layer                              │
└─────────────────────────────────────────────────────────────────────┘
                                   │
                                   ▼
┌─────────────────────────────────────────────────────────────────────┐
│ Forming an electrode layer on the passivation layer covering the    │─── 714
│ at least one opening                                                │
└─────────────────────────────────────────────────────────────────────┘
                                   │
                                   ▼
┌─────────────────────────────────────────────────────────────────────┐
│ Forming a second reflector layer on the passivation layer and the   │─── 716
│ electrode layer                                                     │
└─────────────────────────────────────────────────────────────────────┘
```

FIG. 7

LIGHT EMITTING DIODE STRUCTURE HAVING RESONANT CAVITY AND METHOD FOR MANUFACTURING THE SAME

CROSS-REFERENCE TO RELATED APPLICATION

This application claims the benefit of priority of U.S. Provisional Application No. 63/009,995, filed on Apr. 14, 2020, entitled "Micro-LEDs with resonant cavity," the content of which is incorporated herein by reference in its entirety.

TECHNICAL FIELD

The present disclosure relates to a light emitting diode (LED) structure and a method for manufacturing the LED structure, and more particularly, to a LED structure having a resonant cavity and the method for manufacturing the same.

BACKGROUND

In the recent years, LEDs have become popular in lighting applications. As light sources, LEDs have many advantages including higher light efficiency, lower energy consumption, longer lifetime, smaller size, and faster switching.

Displays having micro-scale LEDs are known as micro-LED. Micro-LED displays have arrays of micro-LEDs forming the individual pixel elements. A pixel may be a minute area of illumination on a display screen, one of many from which an image is composed. In other words, pixels may be small discrete elements that together constitute an image as on a display. Pixels are normally arranged in a two-dimensional (2D) matrix, and are represented using dots, squares, rectangles, or other shapes. Pixels may be the basic building blocks of a display or digital image and with geometric coordinates.

The conventional micro-LEDs have physical characteristics of a large emission angle because of random emission photons of the light emitting material of the micro-LEDs. When the micro-LEDs are used in various applications requiring collimated light emission, e.g., virtual/augmented reality glasses or projectors, the light decrease would be significant, and the contract of the display image would be affected as well.

Another disadvantage of the conventional micro-LEDs is what is known as the red shift. Because the LEDs are made of direct energy gap semiconductors, concerning the spectrum of the emitted light, it is concentrated in and around a specific wavelength defined by the energy gap. By increasing the temperature caused by the continuous use, the band gap energy decreases and the emitted wavelength increases. It follows that the peak wavelength shifts to a longer wavelength (i.e., towards the wavelength of red light) and therefore this shift is generally called the red shift. Hence, the thermal stability is one of the important issues of a color display using micro-LEDs.

A further disadvantage of the conventional micro-LEDs is the luminous efficiency. Comparing to the large-sized LEDs, the external quantum efficiency of the micro-LEDs is relatively low. When the micro-LEDs are applied to the battery-powered consumer electronics, e.g., smart glasses, the luminous efficiency is insufficient to satisfy the requirement.

Embodiments of the disclosure address the above problems by providing a LED structure having a resonant cavity and the method for manufacturing the same, and therefore the drawbacks of light decrease, red shift and low luminous efficiency can be mitigated.

SUMMARY

Embodiments of the LED structure and method for forming the LED structure are disclosed herein.

In one example, a LED structure is disclosed. The LED structure includes a substrate, a LED unit formed on the substrate, a first reflector layer formed between the substrate and the LED unit, and a second reflector layer formed on the LED unit. A common anode layer of the LED unit is formed on the first reflector layer. The first reflector layer, the LED unit and the second reflector layer are configured to collectively provide a resonant cavity.

In another example, a LED structure is disclosed. The LED structure includes a substrate, a first reflector layer formed on the substrate, an optical cavity structure formed on the first reflector layer, and a second reflector layer formed on the optical cavity structure. The optical cavity structure is formed by at least one LED unit surrounded by an ion-implanted material.

In a further example, a method for manufacturing a LED structure is disclosed. A first reflector layer and a semiconductor structure are formed on a first substrate. An implantation operation is performed to form an isolation material surrounding at least one optical cavity unit in the semiconductor structure. A second reflector layer is formed on the semiconductor structure. The first reflector layer, each optical cavity unit and the second reflector layer are configured to collectively provide a resonant cavity.

BRIEF DESCRIPTION OF THE DRAWINGS

The accompanying drawings, which are incorporated herein and form a part of the specification, illustrate implementations of the present disclosure and, together with the description, further serve to explain the present disclosure and to enable a person skilled in the pertinent art to make and use the present disclosure.

FIG. 7 is a flowchart of an exemplary method for manufacturing a LED structure, according to some implementations of the present disclosure.

Figure 1:
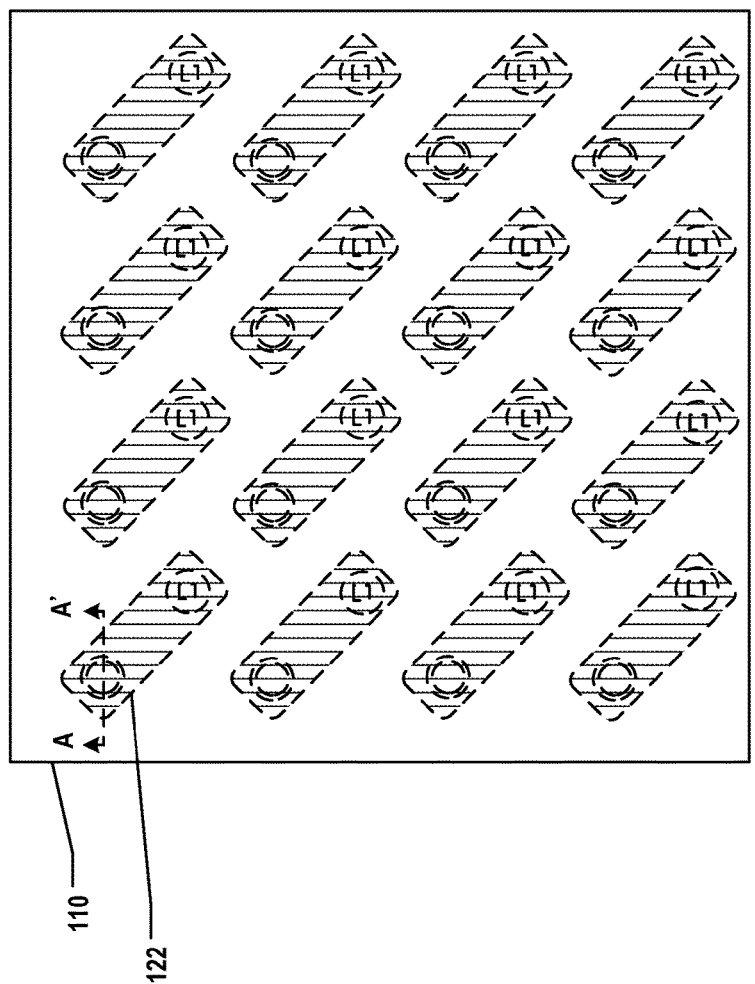
FIG. 1 illustrates a top view of an exemplary LED structure, according to some implementations of the present disclosure.

Implementations of the present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present discloses.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, a semiconductor layer can include one or more doped or undoped semiconductor layers and may have the same or different materials.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, silicon carbide, gallium nitride, germanium, gallium arsenide, indium phosphide, etc. Alternatively, the substrate can be made from an electrically non-conductive material, such as a glass, a plastic, or a sapphire wafer. Further alternatively, the substrate can have semiconductor devices or circuits formed therein.

As used herein, the term "micro" LED, "micro" p-n diode or "micro" device refers to the descriptive size of certain devices or structures according to implementations of the disclosure. As used herein, the terms "micro" devices or structures are meant to refer to the scale of 0.1 to 100 μm. However, it is to be appreciated that implementations of the present disclosure are not necessarily so limited, and that certain aspects of the implementations may be applicable to larger, and possibly smaller size scales.

Figure 2:
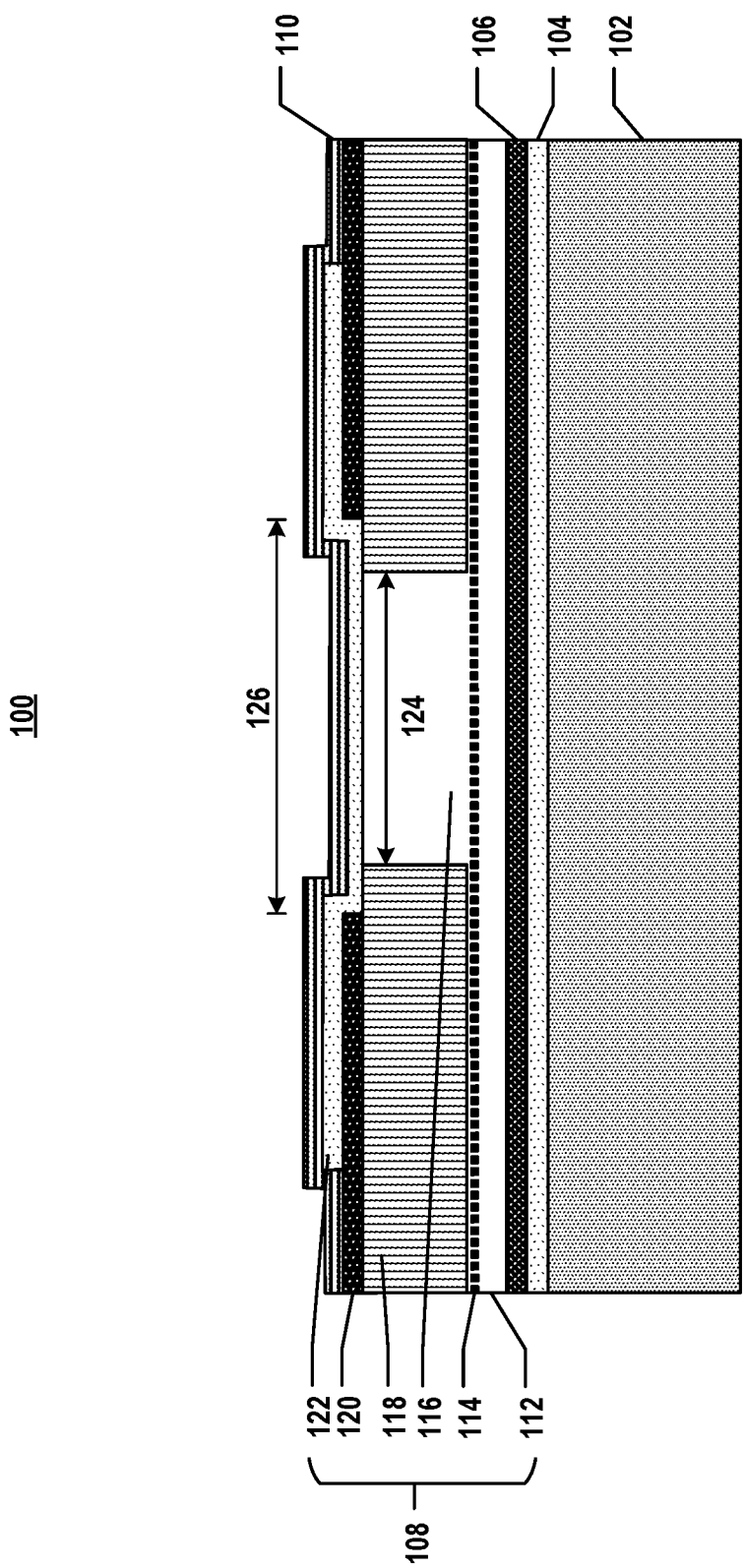
FIG. 2 illustrates a cross-section view of an exemplary LED structure, according to some implementations of the present disclosure.

Implementations of the present disclosure describe a LED structure or a micro-LED structure having a resonant cavity and a method for manufacturing the structure. The LED structure has a first reflector layer and a second reflector layer formed above and beneath the LED units, and a light emitted by the LED units directionally exit the LED structure from the second reflector layer. FIG. 1 illustrates a top view of an exemplary LED structure 100, according to some implementations of the present disclosure, and FIG. 2 illustrates a cross-section view of LED structure 100 along line A-A', according to some implementations of the present disclosure. For the purpose of better describing the embodiment, the top view of LED structure 100 in FIG. 1 and the cross-section view of LED structure 100 in FIG. 2 will be described together.

As shown in FIG. 1, the topmost layer of LED structure 100 is a second reflector layer 110, and other layers, e.g., an electrode layer 122, are covered by second reflector layer 110 and are therefore shown by the dash lines in the top view. As shown in FIG. 2, LED structure 100 includes a first substrate 102, a first reflector layer 106, at least one LED unit 108, and second reflector layer 110. First reflector layer 106 is bonded on first substrate 102 through a bonding layer 104.

In some implementations, first substrate 102 may include a semiconductor material, such as silicon, silicon carbide, gallium nitride, germanium, gallium arsenide, indium phosphide. In some implementations, first substrate 102 may be made from an electrically non-conductive material, such as a glass, a plastic or a sapphire wafer. In some implementations, first substrate 102 may have driving circuits formed therein, and first substrate 102 may be CMOS backplane or TFT glass substrate. The driving circuit provides electronic signals to LED unit 108 to control the luminance. In some implementations, the driving circuit may include an active matrix driving circuit, in which each individual LED unit 108 corresponds to an independent driver. In some implementations, the driving circuit may include a passive matrix driving circuit, in which a plurality of LED units 108 are arranged in an array and are connected to the data lines and the scan lines driven by the driving circuit.

Bonding layer 104 is a layer of an adhesive material formed on first substrate 102 to bond first substrate 102 and first reflector layer 106. In some implementations, bonding layer 104 may include a conductive material, such as metal or metal alloy. In some implementations, bonding layer 104 may include Au, Sn In Cu or Ti. In some implementations, bonding layer 104 may include a non-conductive material, such as polyimide (PI), polydimethylsiloxane (PDMS). In some implementations, bonding layer 104 may include a photoresist, such as SU-8 photoresist. In some implementations, bonding layer 104 may be hydrogen silsesquioxane (HSQ) or divinylsiloxane-bis-benzocyclobutene (DVS-BCB). It is understood that the descriptions of the material of bonding layer 104 are merely illustrative and are not limiting, and those skilled in the art can change according to requirements, all of which are within the scope of the present application.

First reflector layer 106 is formed on bonding layer 104. In some implementations, first reflector layer 106 may include a reflective p-type Ohmic contact layer. First reflector layer 106 may provide a current conduction from LED unit 108 to bonding layer 104. First reflector layer 106 may also function as a metal mirror to reflect the light emitted by LED unit 108 to second reflector layer 110. In some implementations, first reflector layer 106 may be a metal or metal alloy layer having a high reflectivity, e.g., silver, aluminum, gold, and their alloys. It is understood that the descriptions of the material of first reflector layer 106 are merely illustrative and are not limiting, and other materials are also contemplated, all of which are within the scope of the present application.

LED unit 108 is formed on first reflector layer 106. In some implementations, LED unit 108 may include a first doping type semiconductor layer 112, a second doping type semiconductor layer 116, and a multiple quantum well (MQW) layer 114 formed between first doping type semiconductor layer 112 and second doping type semiconductor layer 116. In some implementations, first doping type semiconductor layer 112 and second doping type semiconductor layer 116 may include one or more layers formed with II-VI materials, such as ZnSe or ZnO, or III-V nitride materials, such as GaN, AlN, InN, InGaN, GaP, AlInGaP, AlGaAs, and their alloys.

In some implementations, first doping type semiconductor layer 112 may be a p-type semiconductor layer that extends across multiple LED units 108 and forms a common anode of these LED units 108. In some implementations, first doping type semiconductor layer 112 may include p-type GaN. In some implementations, first doping type semiconductor layer 112 may be formed by doping magnesium (Mg) in GaN. In some implementations, first doping type semiconductor layer 112 may include p-type InGaN. In some implementations, first doping type semiconductor layer 112 may include p-type AlInGaP. As mentioned above, first reflector layer 106 may include a reflective p-type Ohmic contact layer, and therefore first reflector layer 106 may provide a current conduction from p-type semiconductor layer to bonding layer 104.

In some implementations, second doping type semiconductor layer 116 may be a n-type semiconductor layer and form a cathode of LED unit 108. In some implementations, second doping type semiconductor layer 116 may include n-type GaN. In some implementations, second doping type semiconductor layer 116 may include n-type InGaN. In some implementations, second doping type semiconductor layer 116 may include n-type AlInGaP. Second doping type semiconductor layers 116 of different LED units 108 are electrically isolated, thus each LED unit 108 having a cathode that can have a voltage level different from the other units.

As a result of the disclosed implementations, a plurality of individually functionable LED units 108 are formed with their first doping type semiconductor layers 112 horizontally extended across the adjacent LED units, and their second doping type semiconductor layers 116 electrically isolated between the adjacent LED units. Each LED unit 108 further includes MQW layer 114 formed between first doping type semiconductor layer 112 and second doping type semiconductor layer 116. MQW layer 114 is the active region of LED unit 108.

In some implementations, second doping type semiconductor layers 116 is divided by an isolation material 118. As shown in FIG. 2, second doping type semiconductor layers 116 is surrounded by isolation material 118. In some implementations, isolation material 118 may be an ion-implanted material. In some implementations, isolation material 118 may be formed by implanting ion materials in second doping type semiconductor layers 116. In some implementations, isolation material 118 may be formed by implanting $H^+$, $He^+$, $N^+$, $O^+$, $F^+$, $Mg^+$, $Si^+$ or $Ar^+$ ions in second doping type semiconductor layers 116. In some implementations, second doping type semiconductor layers 116 may be implanted with one or more ion materials to form isolation material 118. Isolation material 118 has the physical properties of electrical insulation. By implanting the ion material in a defined area of second doping type semiconductor layers 116, the material of second doping type semiconductor layers 116 in the defined area may be transformed to isolation material 118, which electrically isolates LED mesas of multiple LED units 108 from each other.

Isolation material 118 is formed surrounding second doping type semiconductor layer 116, and isolation material 118 is nonconductive and therefore could confine the current flow within light aperture region 124. As a result, an optical cavity is formed in LED unit 108. Second doping type semiconductor layers 116 and isolation material 118 may have different refractive indexes. In some implementations, the refractive index of isolation material 118 is lower than the refractive index of second doping type semiconductor layers 116. Because the ion implantation operation may transfer the single crystal structure of second doping type semiconductor layers 116 to the partially amorphous structure of isolation material 118, and the partially amorphous region presents a lower refractive index than the single crystal structure, there is a refractive index change in second doping type semiconductor layers 116.

As mentioned above, LED unit 108 includes first doping type semiconductor layer 112, second doping type semiconductor layer 116 and MQW layer 114, and isolation material 118 is formed in second doping type semiconductor layer 116 through implantation. Because isolation material 118 has the physical properties of electrical insulation and could confine the current flow within light aperture region 124 formed by second doping type semiconductor layer 116, the optical cavity is formed in LED unit 108 having an opening size as light aperture region 124.

As shown in FIG. 2, LED unit 108 may further include a passivation layer 120 and an electrode layer 122 formed on isolation material 118 and second doping type semiconductor layers 116. Passivation layer 120 may be used for protecting and isolating LED unit 108. In some implementations, passivation layer 120 may include $SiO_2$, $Al_2O_3$, SiN or other suitable materials. In some implementations, passivation layer 120 may include polyimide, SU-8 photoresist, or other photo-patternable polymer. Electrode layer 122 is formed on a portion of passivation layer 120, and electrode layer 122 electrically connects second doping type semiconductor layer 116 through an opening 126 on passivation layer 120. In some implementations, electrode layer 122 may be transparent conductive materials, such as indium tin oxide (ITO) or zinc oxide (ZnO).

Referring to FIG. 2, opening 126 on passivation layer 120 is larger than light aperture region 124 formed by second doping type semiconductor layers 116. The whole area of light aperture region 124 is covered by transparent electrode layer 122. Hence, the light emitted from light aperture region 124 would not be blocked or interfered by passivation layer 120.

Second reflector layer 110 is formed on LED unit 108. In some implementations, second reflector layer 110 may be a distributed Bragg reflector (DBR). In some implementations, second reflector layer 110 may include multiple pairs of $TiO_2/SiO_2$ layers or multiple pairs of $SiO_2/HfO_2$ layers. In some implementations, second reflector layer 110 may include 3 to 10 pairs of $TiO_2/SiO_2$ layers or 3 to 10 pairs of $SiO_2/HfO_2$ layers.

A first reflectivity of first reflector layer 106 is greater than a second reflectivity of second reflector layer 110. As a result of the disclosed implementations, first reflector layer 106, LED unit 108 and second reflector layer 110 collectively provide a resonant cavity, and the light emitted by LED unit 108 exits LED structure 100 from second reflector layer 110.

Figure 3:
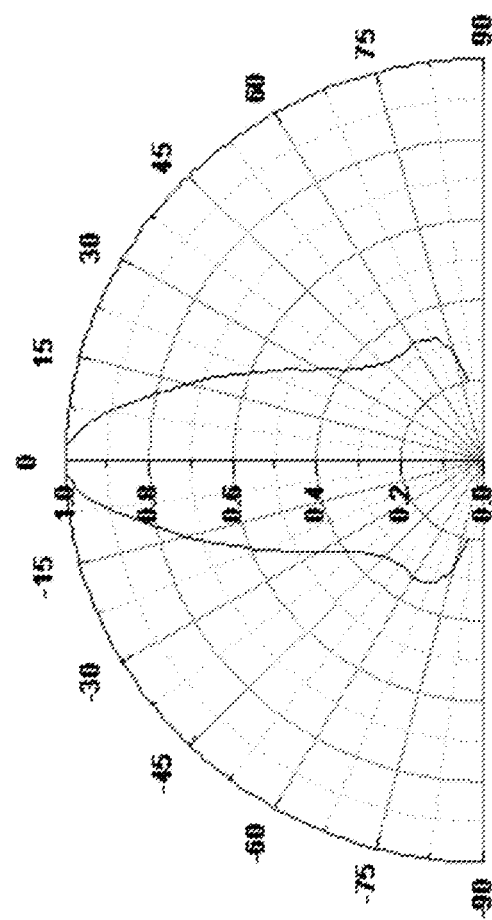
FIG. 3 illustrates a light-emitting directionality of an exemplary LED structure, according to some implementations of the present disclosure.

FIG. 3 illustrates a light-emitting directionality of LED structure 100, according to some implementations of the present disclosure. As shown in FIG. 3, a smaller half-power angle of approximately 27° to 30° may be obtained by the disclosed implementations. Because the resonant cavity effect may increase the directionality of light waves of LED structure 100, the extraction efficiency is improved. Extraction efficiency may be also known as the optical efficiency. When the photons are produced within the LED structure, they have to escape from the crystal in order to produce a light-emitting effect. Extraction efficiency is the proportion of photons generated in the active region that escape from the LED structure. Since the directionality of light waves of LED structure 100 is improved by using the resonant cavity, the photons escaping from second reflector layer 110 of LED structure 100 are increased and the extraction efficiency is improved.

Figure 4:
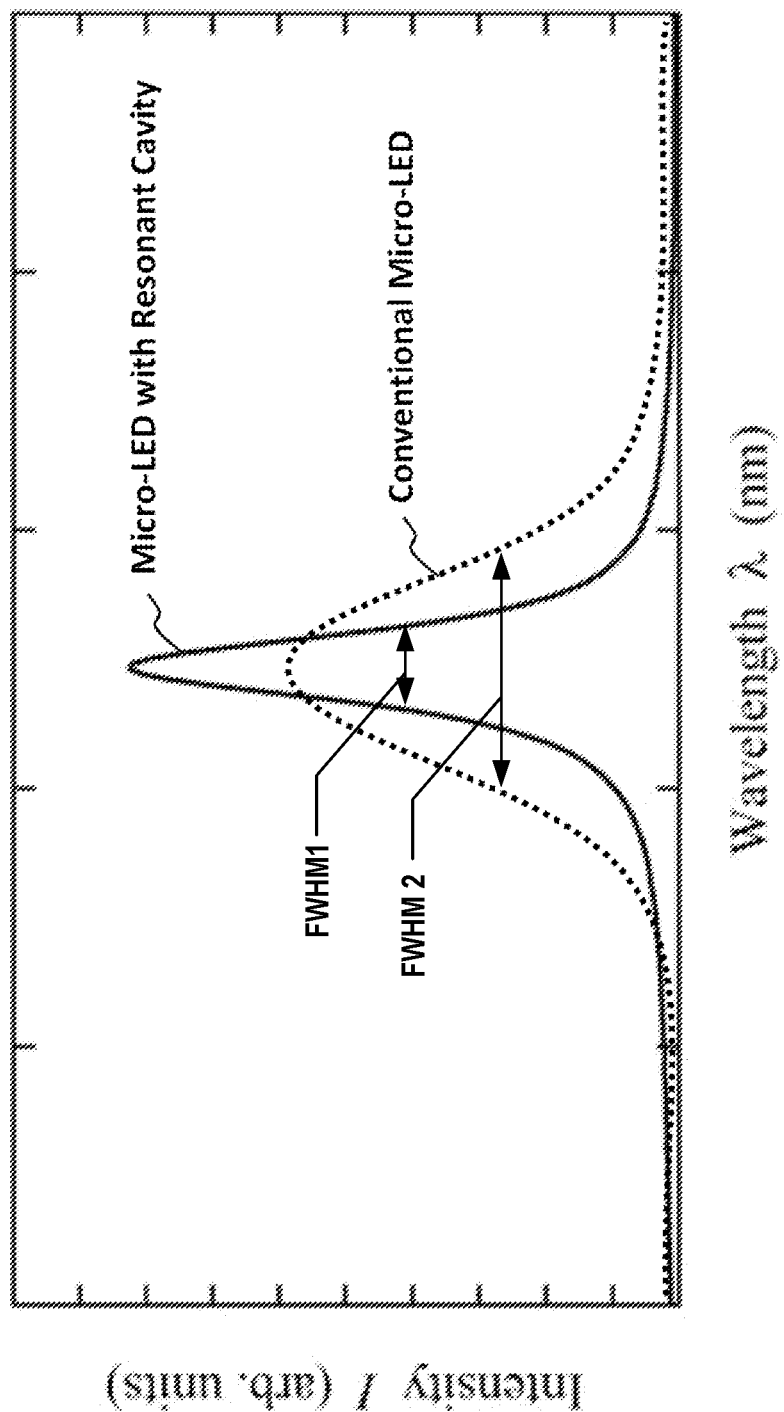
FIG. 4 illustrates a spectrum of an exemplary LED structure, according to some implementations of the present disclosure.

FIG. 4 illustrates a comparison of spectra between the conventional LED structure and LED structure 100, according to some implementations of the present disclosure. FIG. 4 shows optical properties of LED structure 100 having the resonant cavity may have narrower resonant wavelength peaks. In other words, the full width at half maximum 1 (FWHM 1) of LED structure 100 is distinctly smaller than FWHM 2 of a convention LED. LEDs are characterized by pure and saturated emission colors with narrow bandwidth and a light source with narrower FWHM would lead to a wider color gamut. With a smaller FWHM, the spectral purity of LED structure 100 having the resonant cavity is improved.

By using first reflector layer 106, LED unit 108 and second reflector layer 110 to collectively form a resonant cavity, the light emitted downward or sideward by LED unit 108 may be reflected by first reflector layer 106, and isolation material 118 may confine the current flow within light aperture region 124 and provide superior optical confinement. As a result, the light emitted by LED unit 108 directionally exits LED structure 100 from second reflector layer 110. Hence, the disclosed implementations have superior directionality of the emitted light, stable peak wavelength, spectral purity, and high external quantum efficiency.

FIGS. 5A-5H illustrate cross sections of LED structure 100 at different stages of a manufacturing process, according to some implementations of the present disclosure. FIGS. 6A-6E illustrate top views of LED structure 100 at different stages of a manufacturing process, according to some implementations of the present disclosure. FIG. 7 is a flowchart of a method 700 for manufacturing LED structure 100, according to some implementations of the present disclosure. For the purpose of better explaining the present disclosure, FIGS. 5A-5H, FIGS. 6A-6E and FIG. 7 will be described together.

Figure 5A:
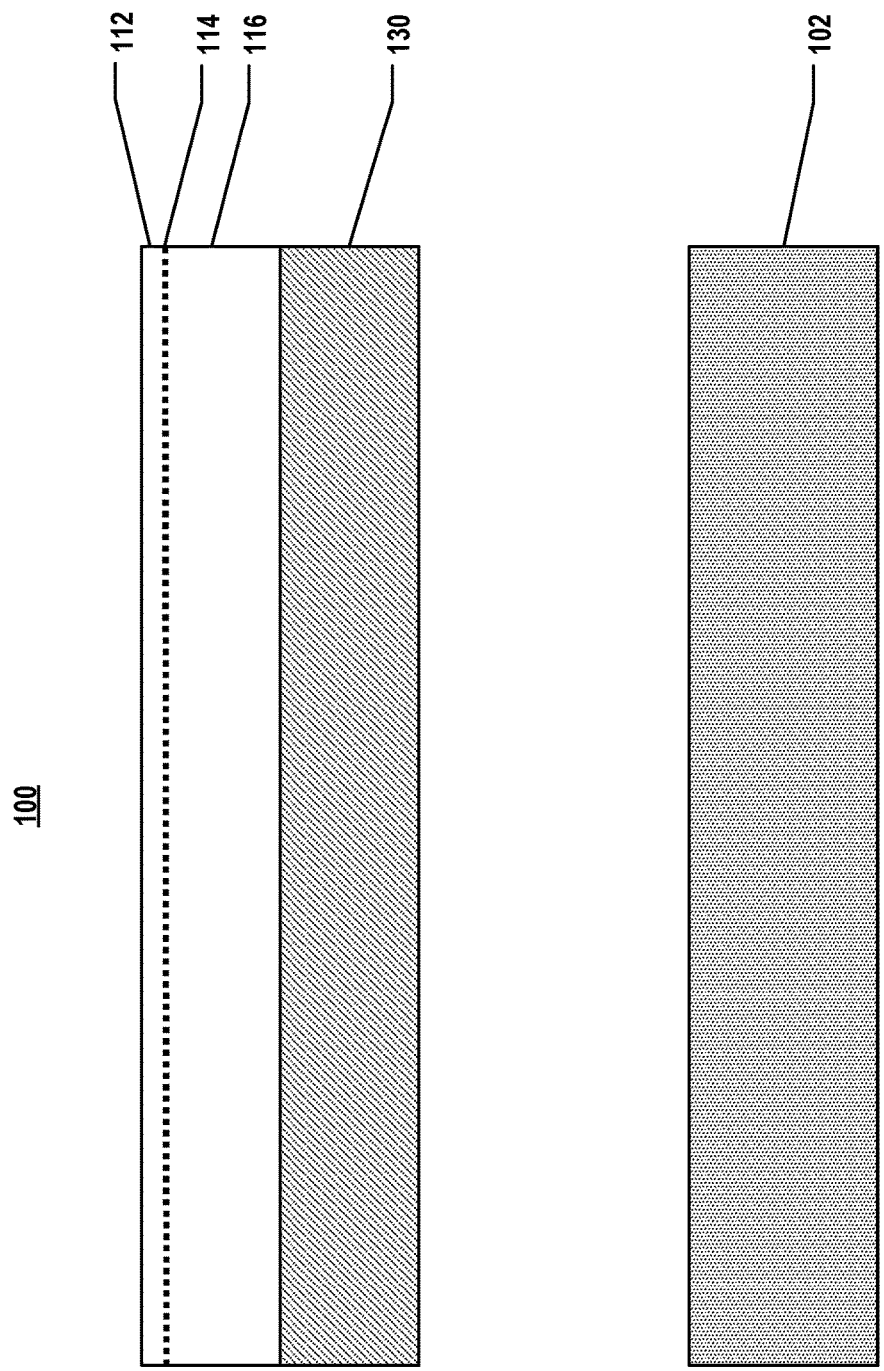
FIGS. 5A-5H illustrate cross sections of an exemplary LED structure at different stages of a manufacturing process, according to some implementations of the present disclosure.

In FIG. 5A, a driving circuit (not shown) may be formed in first substrate 102. For example, the driving circuit may include CMOS devices manufactured on a silicon wafer. For another example, the driving circuit may include TFTs manufactured on a glass substrate. As shown in operation 702 of FIG. 7, a semiconductor layer is formed on a second substrate 130, and the semiconductor layer includes first doping type semiconductor layer 112, second doping type semiconductor layer 116 and MQW layer 114.

In some implementations, first substrate 102 or second substrate 130 may include a semiconductor material, such as silicon, silicon carbide, gallium nitride, germanium, gallium arsenide, indium phosphide. In some implementations, first substrate 102 or second substrate 130 may be made from an electrically non-conductive material, such as a glass, a plastic or a sapphire wafer. In some implementations, first substrate 102 may have driving circuits formed therein, and first substrate 102 may include a CMOS backplane or TFT glass substrate. In some implementations, first doping type semiconductor layer 112 and second doping type semiconductor layer 116 may include one or more layers based on II-VI materials, such as ZnSe or ZnO, or III-V nitride materials, such as GaN, AlN, InN, InGaN, GaP, AlInGaP, AlGaAs, and their alloys. In some implementations, first doping type semiconductor layer 112 may include a p-type semiconductor layer, and second doping type semiconductor layer 116 may include a n-type semiconductor layer.

Figure 5B:
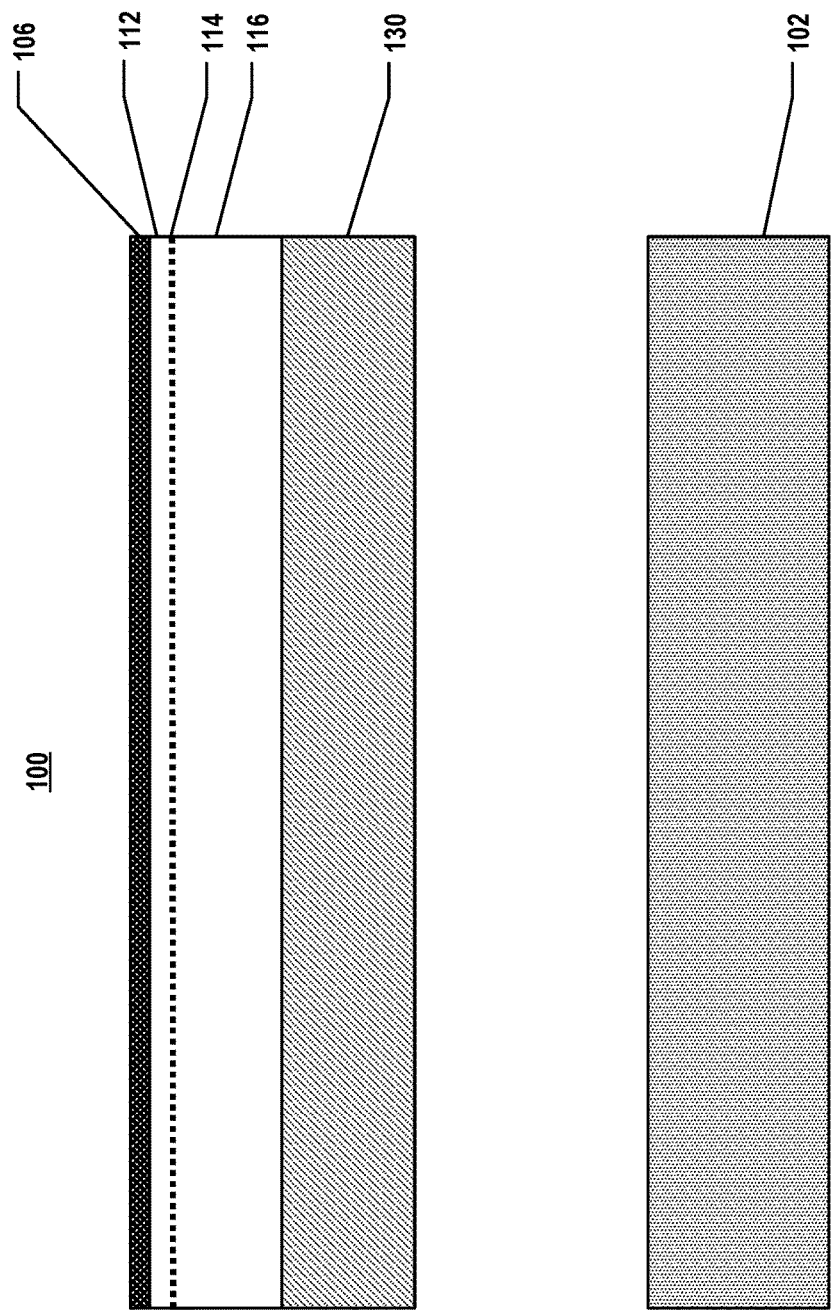

Referring to FIG. 5B and operation 704 of FIG. 7, first reflector layer 106 is formed on first doping type semiconductor layer 112. In some implementations, first reflector layer 106 may be a reflective p-type Ohmic contact layer. First reflector layer 106 may provide a current conduction from first doping type semiconductor layer 112 to the later-formed bonding layer 104. First reflector layer 106 may also function as a metal mirror to reflect the light emitted by LED unit 108 to second reflector layer 110. In some implementations, first reflector layer 106 may be a metal or metal alloy layer having a high reflectivity, e.g., silver, aluminum, gold, and their alloys. In some implementations, first reflector layer 106 may be formed using chemical vapor deposition (CVD), physical vapor deposition (PVD), atomic layer deposition (ALD), plasma enhanced CVD (PECVD), plasma enhanced ALD (PEALD), other suitable processes, and/or combinations thereof.

Figure 5C:
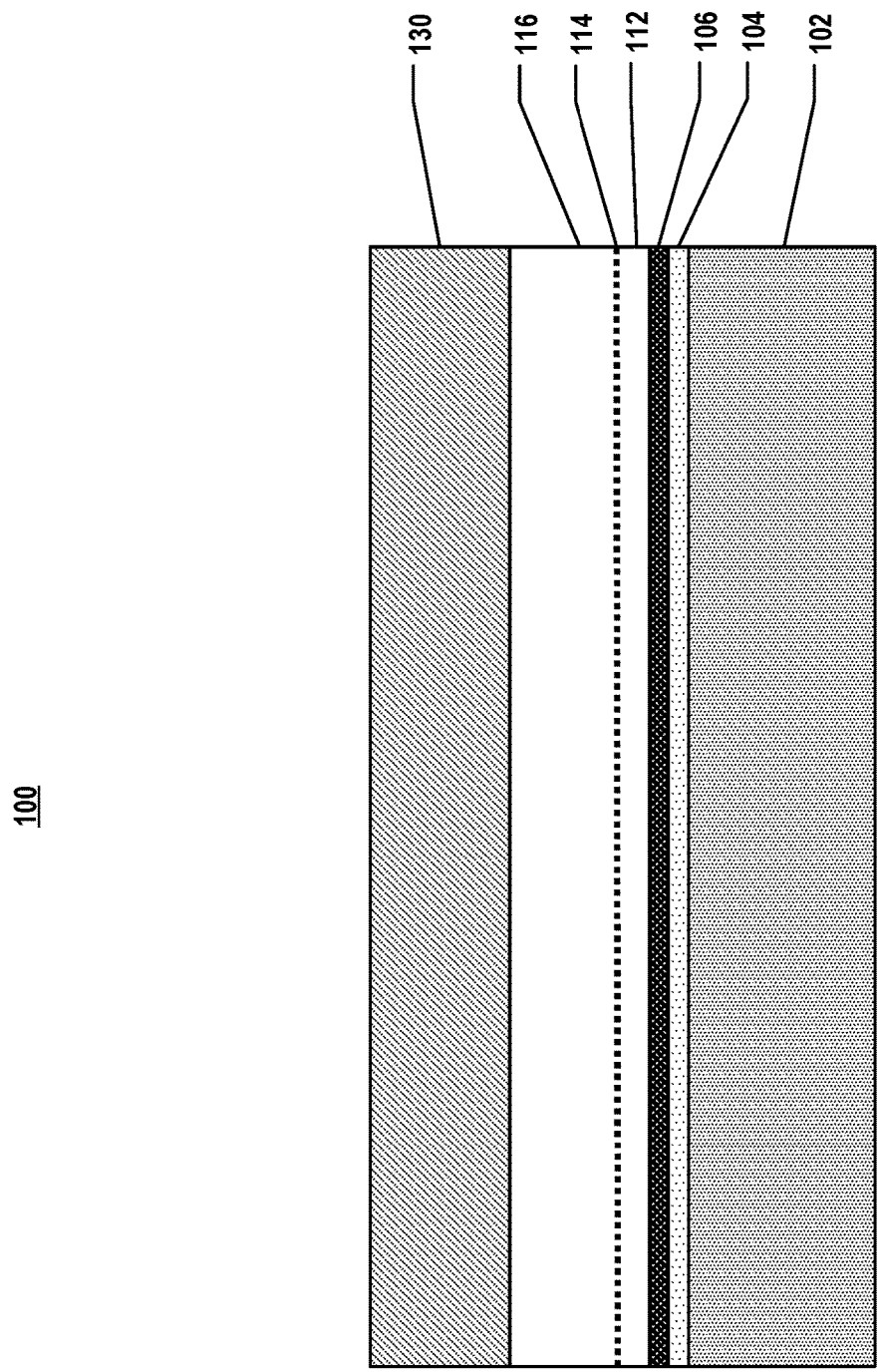

As shown in FIG. 5C and operation 706 of FIG. 7, second substrate 130, first reflector layer 106 and the semiconductor layer, including first doping type semiconductor layer 112, second doping type semiconductor layer 116 and MQW layer 114, are flipped over and bonded to first substrate 102 through bonding layer 104. In some implementations, bonding layer 104 may include a conductive material, such as metal or metal alloy. In some implementations, bonding layer 104 may include Au. Sn In Cu or Ti. In some implementations, bonding layer 104 may include a non-conductive material, such as polyimide (PI), or polydimethylsiloxane (PDMS). In some implementations, bonding layer 104 may include a photoresist, such as SU-8 photoresist. In some implementations, bonding layer 104 may include hydrogen silsesquioxane (HSQ) or divinylsiloxane-bis-benzocyclobutene (DVS-BCB).

Figure 5D:
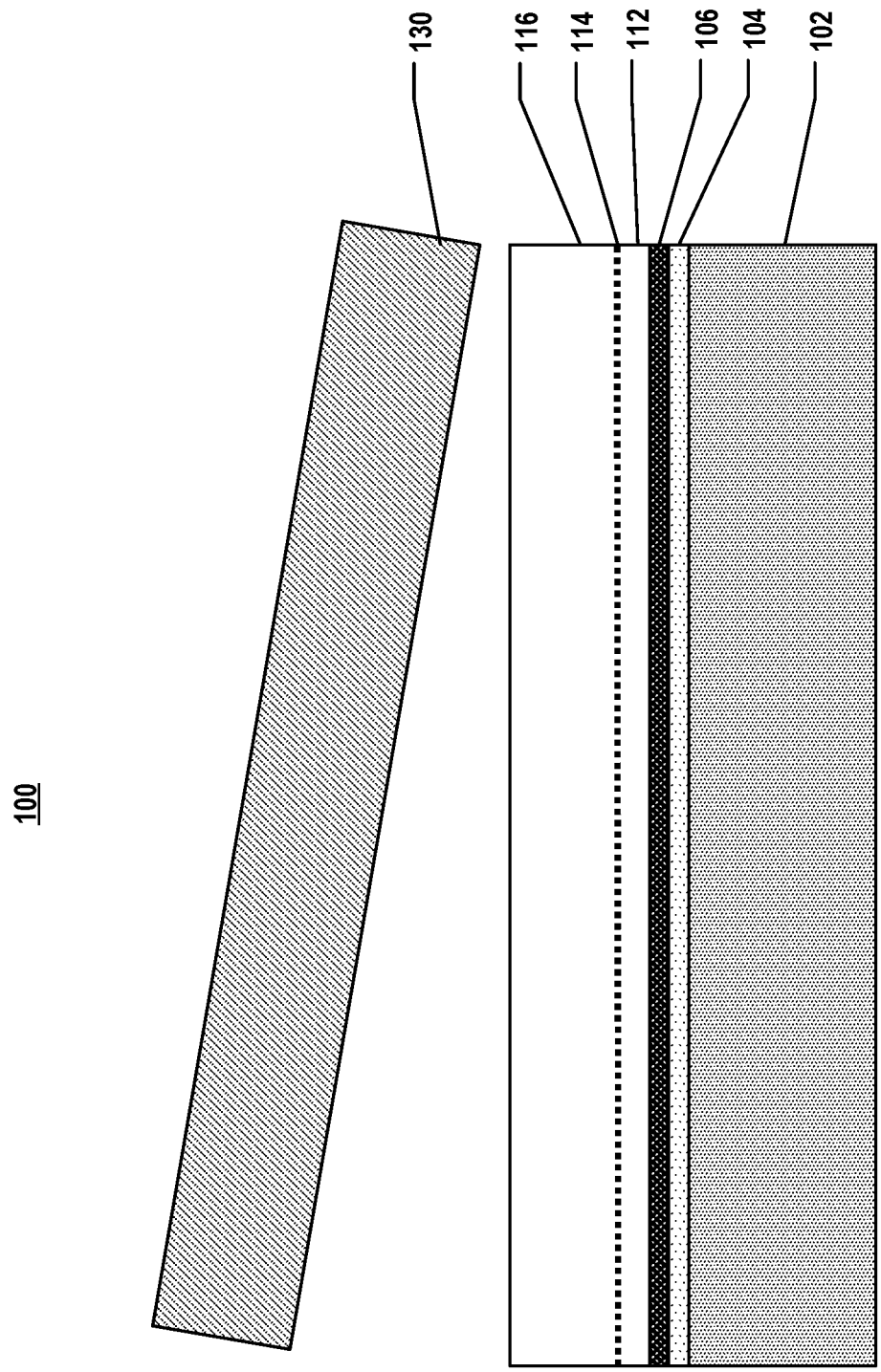
Figure 6B:
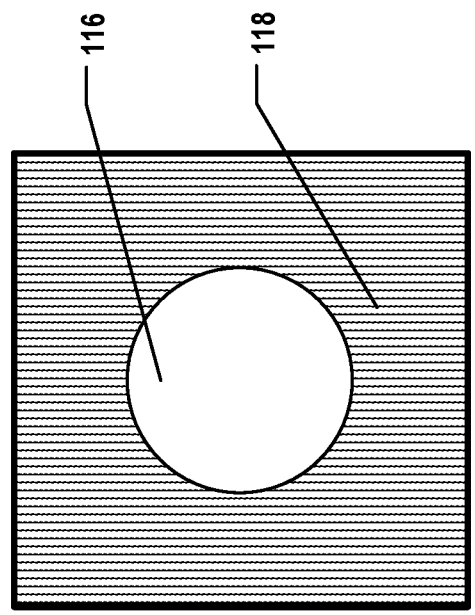
FIGS. 6A-6E illustrate top views of an exemplary LED structure at different stages of a manufacturing process, according to some implementations of the present disclosure.
Figure 6A:
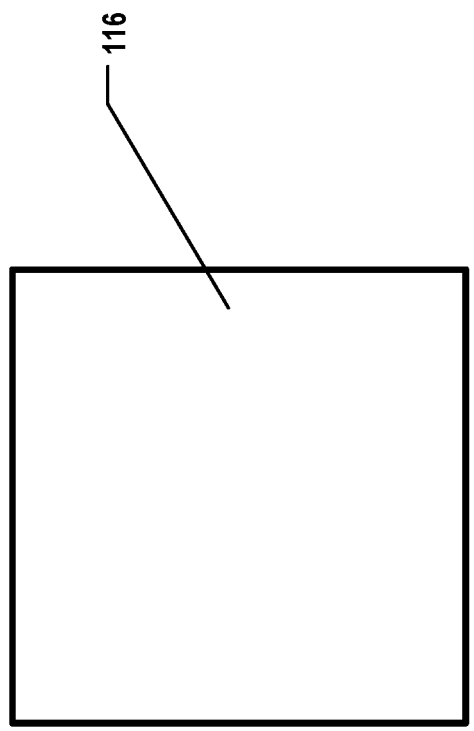

Then, as shown in FIG. 5D and operation 708 of FIG. 7, second substrate 130 may be removed from the semiconductor layer. In some implementations, a thinning operation may be optionally performed on second doping type semiconductor layer 116 to remove a portion of second doping type semiconductor layer 116. For example, FIG. 6A shows a top view of second doping type semiconductor layer 116, or second doping type semiconductor layer 116 after the thinning operation. In some implementations, the thinning operation may include a dry etching or a wet etching operation. In some implementations, the thinning operation may include a chemical-mechanical polishing (CMP) operation.

Figure 5E:
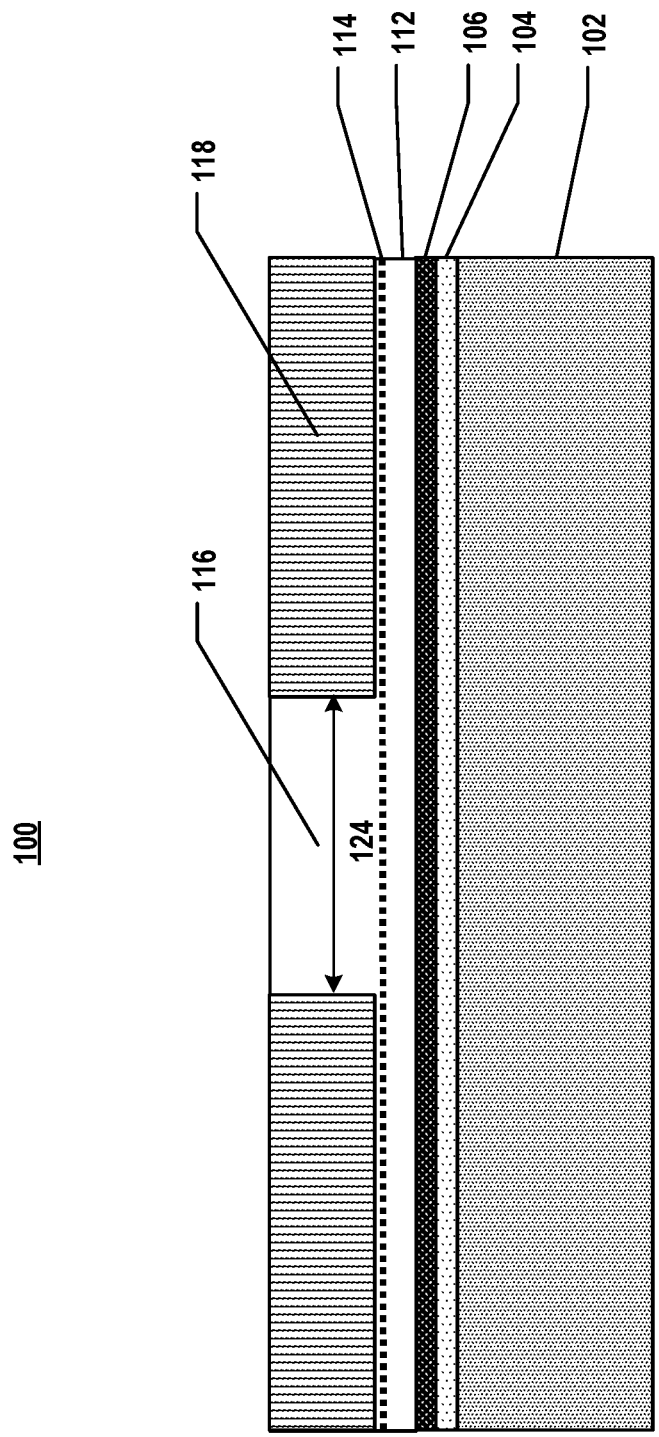

Referring to FIG. 5E and operation 710 of FIG. 7, an implantation operation is performed to form an isolation material 118 in second doping type semiconductor layer 116, and as a result of the implantation, second doping type semiconductor layer 116 is surrounded by isolation material 118. After the implantation, second doping type semiconductor layer 116 of LED unit 108 is electrically isolated from other second doping type semiconductor layer 116 of adjacent LED unit 108 by isolation material 118. For example, FIG. 6B shows a top view of LED structure 100 after the implantation operation.

In some implementations, isolation material 118 may be formed by implanting ion materials to a defined region in second doping type semiconductor layers 116. In some implementations, isolation material 118 may be formed by implanting $H^+$, $He^+$, $N^+$, $O^+$, $F^+$, $Mg^+$, $Si^+$ or $Ar^+$ ions in second doping type semiconductor layers 116. In some implementations, second doping type semiconductor layers 116 may be implanted with one or more ion materials to form isolation material 118. Isolation material 118 has the physical properties of electrical insulation. In some implementations, the implantation operation may be performed with an implantation power between about 10 keV and about 300 keV. In some implementations, the implantation operation may be performed with an implantation power between about 15 keV and about 250 keV. In some implementations, the implantation operation may be performed with an implantation power between about 20 keV and about 200 keV. In some implementations, isolation material 118 may be formed in second doping type semiconductor layers 116 for a depth not sufficient to penetrate MQW layer 114. In some implementations, the implantation depth of isolation material 118 may be controlled so that isolation material 118 stops short to contact MQW layer 114. It is understood that the location, shape, and depth of isolation material 118 are merely illustrative and are not limiting, and those skilled in the art can change according to requirements, all of which are within the scope of the present application.

LED unit 108 includes first doping type semiconductor layer 112, second doping type semiconductor layer 116 and MQW layer 114, and isolation material 118 is formed surrounding second doping type semiconductor layer 116 through implantation. Because isolation material 118 is formed surrounding second doping type semiconductor layer 116, a light aperture region 124 is formed, as shown in FIG. 5E. Isolation material 118 may confine the current flow within light aperture region 124 and an optical cavity is formed in LED unit 108.

In addition, second doping type semiconductor layers 116 and isolation material 118 may have different refractive indexes. In some implementations, the refractive index of isolation material 118 is lower than the refractive index of second doping type semiconductor layers 116. Because the ion implantation operation may transfer the single crystal structure of second doping type semiconductor layers 116 to the partially amorphous structure of isolation material 118, and the partially amorphous region presents a lower refractive index than the single crystal structure, a refractive index change occurs in second doping type semiconductor layer 116 and isolation material 118. The refractive index change may further provide optical confinement and the probability of total reflection of the emission light increases in the light aperture region.

Figure 5F:
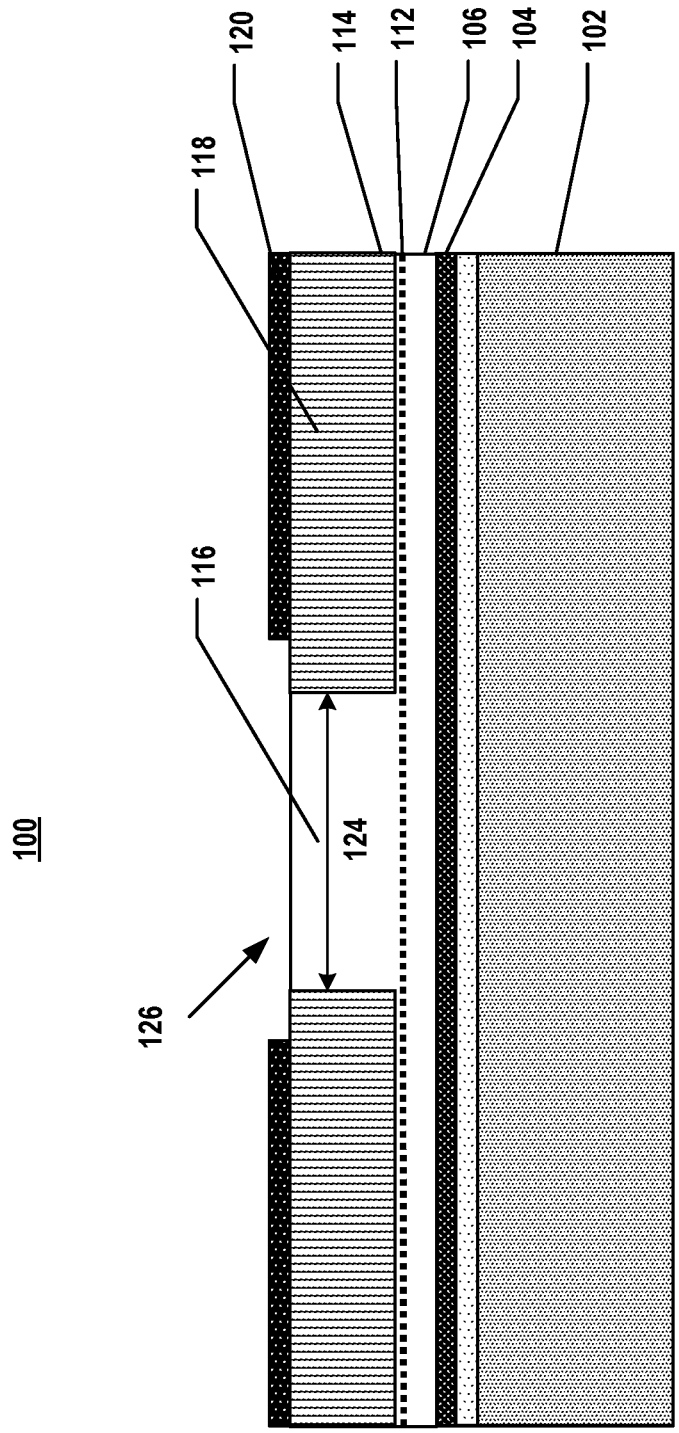
Figure 6D:
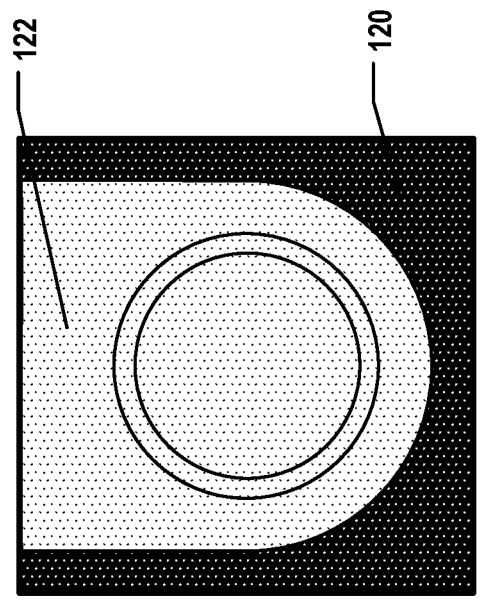
Figure 6C:
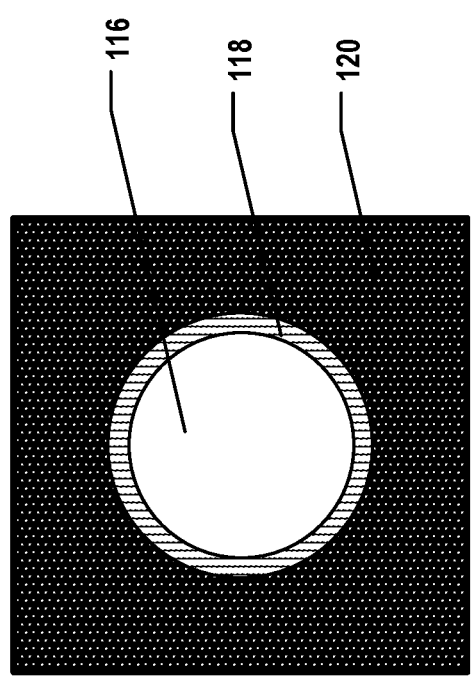

Referring to FIG. 5F and operation 712 of FIG. 7, passivation layer 120 is formed on isolation material 118, and opening 126 is formed on passivation layer 120 exposing a portion of isolation material 118 and second doping type semiconductor layer 116. Opening 126 on passivation layer 120 is larger than light aperture region 124 formed by second doping type semiconductor layers 116. The whole area of light aperture region 124 is covered by later-formed transparent electrode layer 122. Hence, the light emitted from light aperture region 124 would not be blocked or interfered by passivation layer 120. For example, FIG. 6C shows a top view of LED structure 100 after forming passivation layer 120. In some implementations, passivation layer 120 may include $SiO_2$, $Al_2O_3$, SiN or other suitable materials for isolation and protection. In some implementations, passivation layer 120 may include polyimide, SU-8 photoresist, or other photo-patternable polymer.

Figure 5G:
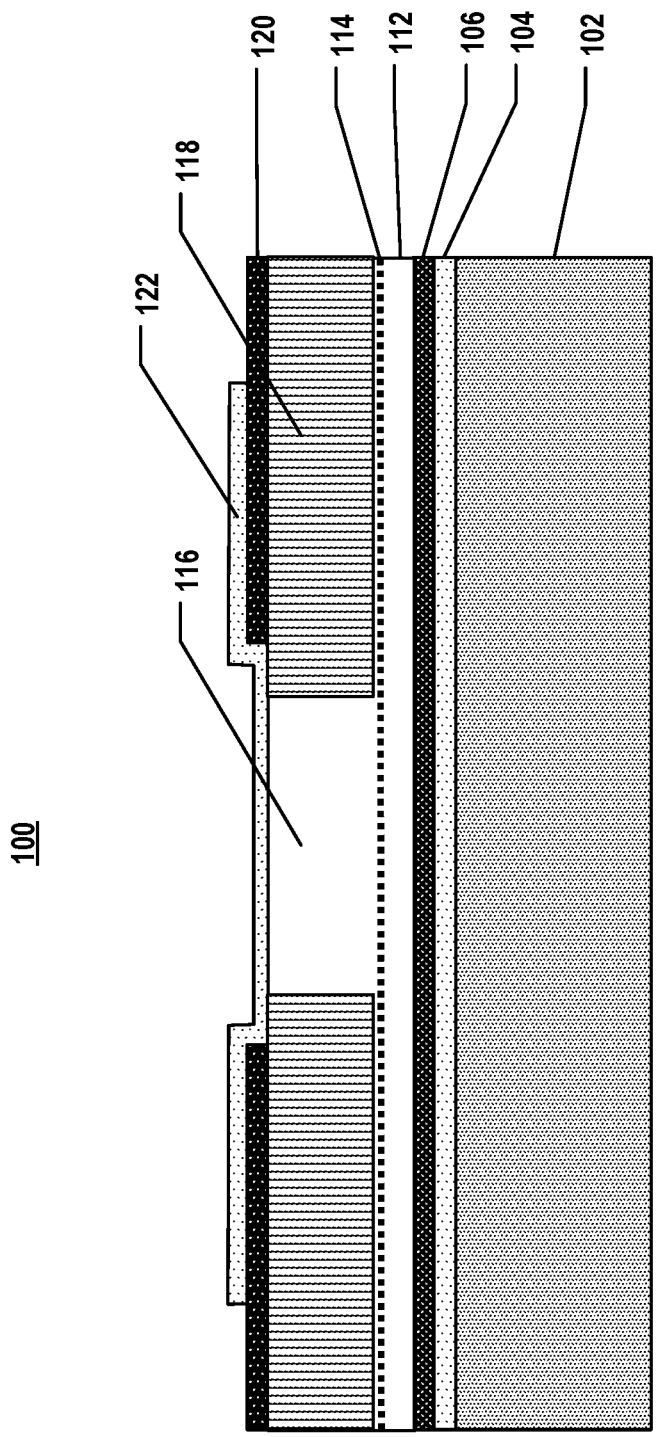

Referring to FIG. 5G and operation 714 of FIG. 7, electrode layer 122 is formed on passivation layer 120 covering opening 126. Electrode layer 122 electrically connects second doping type semiconductor layer 116 and the driving circuit in first substrate 102. The driving circuit may control the voltage and current level of second doping type semiconductor layer 116 through electrode layer 122. For example, FIG. 6D shows a top view of LED structure 100 after forming electrode layer 122. In some implementations, electrode layer 122 may include conductive materials, such as indium tin oxide (ITO), Cr, Ti, Pt, Au, Al, Cu, Ge or Ni.

Figure 5H:
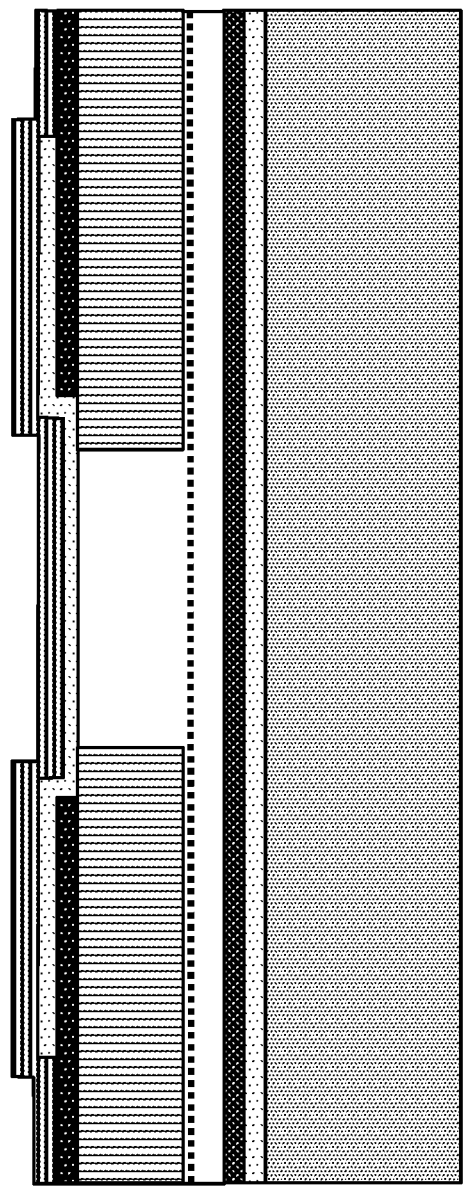
Figure 6E:
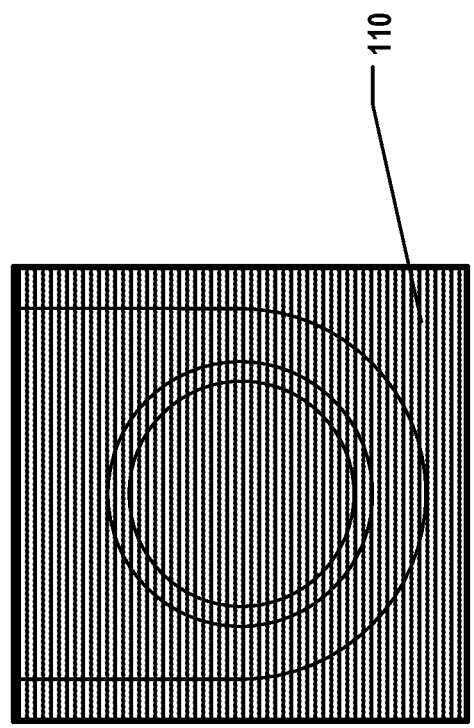

Referring to FIG. 5H and operation 716 of FIG. 7, second reflector layer 110 is formed on passivation layer 120 and electrode layer 122. FIG. 6E shows a top view of LED structure 100 after forming second reflector layer 110. In some implementations, second reflector layer 110 may be a distributed Bragg reflector (DBR). In some implementations, second reflector layer 110 may include multiple pairs of $TiO_2/SiO_2$ layers or multiple pairs of $SiO_2/HfO_2$ layers. In some implementations, second reflector layer 110 may include 3 to 10 pairs of $TiO_2/SiO_2$ layers or 3 to 10 pairs of $SiO_2/HfO_2$ layers.

A first reflectivity of first reflector layer 106 is greater than a second reflectivity of second reflector layer 110. As a result of the disclosed implementations, first reflector layer 106, LED unit 108 and second reflector layer 110 collectively provide a resonant cavity, and the light emitted by LED unit 108 exits LED structure 100 from second reflector layer 110.

By using first reflector layer 106, LED unit 108 and second reflector layer 110 to collectively form a resonant cavity, the light emitted downward or sideward by LED unit 108 may be reflected by first reflector layer 106, and isolation material 118 may confine the current flow within light aperture region 124 and provide superior optical confinement. As a result, the light emitted by LED unit 108 directionally exits LED structure 100 from second reflector layer 110. Hence, the disclosed implementations have superior directionality of the emitted light, stable peak wavelength, spectral purity, and high external quantum efficiency.

According to one aspect of the present disclosure, a LED structure is disclosed. The LED structure includes a substrate, a LED unit formed on the substrate, a first reflector layer formed between the substrate and the LED unit, and a second reflector layer formed on the LED unit. A common anode layer of the LED unit is formed on the first reflector layer. The first reflector layer, the LED unit and the second reflector layer are configured to collectively provide a resonant cavity.

In some implementations, a first reflectivity of the first reflector layer is greater than a second reflectivity of the second reflector layer, and a light emitted by the LED unit exits the LED structure from the second reflector layer. In some implementations, the second reflector layer is a distributed Bragg reflector (DBR). In some implementations, the DBR includes a plurality of $TiO_2/SiO_2$ layers or a plurality of $SiO_2/HfO_2$ layers.

In some implementations, the LED unit includes a first doping type semiconductor layer, a multiple quantum well (MQW) layer and a second doping type semiconductor layer. The first doping type semiconductor layer is formed on the first reflector layer. The MQW layer is formed on the first doping type semiconductor layer. The second doping type semiconductor layer is formed on the MQW layer. The second doping type semiconductor layer includes an isolation material made through implantation, and the isolation material divides the second doping type semiconductor layer into a plurality of LED mesas. A first refractive index of the isolation material is lower than a second refractive index of the LED mesas.

In some implementations, the first reflector layer is a first doping type Ohmic contact layer. In some implementations, the LED unit further includes a passivation layer formed on the second doping type semiconductor layer, and an electrode layer formed on the passivation layer in contact with a portion of the second doping type semiconductor layer through an opening on the passivation layer. An aperture of the LED mesas is smaller than the opening on the passivation layer.

According to another aspect of the present disclosure, a LED structure is disclosed. The LED structure includes a substrate, a first reflector layer, an optical cavity structure and a second reflector layer. The first reflector layer is formed on the substrate. The optical cavity structure is formed on the first reflector layer. The second reflector layer is formed on the optical cavity structure. The optical cavity structure is formed by at least one LED unit surrounded by an ion-implanted material.

In some implementations, the second reflector layer is a distributed Bragg reflector (DBR). In some implementations, the DBR includes a plurality of $TiO_2/SiO_2$ layers or a plurality of $SiO_2/HfO_2$ layers. In some implementations, a first reflectivity of the first reflector layer is greater than a second reflectivity of the second reflector layer.

In some implementations, the LED unit includes a first doping type semiconductor layer, a multiple quantum well (MQW) layer and a second doping type semiconductor layer. The first doping type semiconductor layer is formed on the first reflector layer. The MQW layer is formed on the first doping type semiconductor layer. The second doping type semiconductor layer is formed on the MQW layer. The second doping type semiconductor layer includes an isolation material made through implantation, and the isolation material divides the second doping type semiconductor layer into a plurality of LED mesas. A first refractive index of the isolation material is lower than a second refractive index of the LED mesas.

In some implementations, the first reflector layer is a first doping type Ohmic contact layer. In some implementations, the LED unit further includes a passivation layer formed on the second doping type semiconductor layer, and an electrode layer formed on the passivation layer in contact with a portion of the second doping type semiconductor layer through an opening on the passivation layer. An aperture of the LED mesas is smaller than the opening on the passivation layer.

According to a further aspect of the present disclosure, a method for manufacturing a LED structure is disclosed. A first reflector layer and a semiconductor structure are formed on a first substrate. An implantation operation is performed to form an isolation material surrounding at least one optical cavity unit in the semiconductor structure. A second reflector layer is formed on the semiconductor structure. The first reflector layer, each optical cavity unit and the second reflector layer are configured to collectively provide a resonant cavity.

In some implementations, a first doping type semiconductor layer is formed on the first reflector layer. A multiple quantum well (MQW) layer is formed on the first doping type semiconductor layer. A second doping type semiconductor layer is formed on the MQW layer.

In some implementations, the implantation operation is performed to form an ion-implanted material in the second doping type semiconductor layer to divide the second doping type semiconductor layer into a plurality of LED mesas. Each LED mesa is electrically isolated by the ion-implanted material.

In some implementations, a first refractive index of the ion-implanted material is lower than a second refractive index of the LED mesas. In some implementations, a distributed Bragg reflector (DBR) is formed on the semiconductor structure. The DBR includes a plurality of $TiO_2/SiO_2$ layers or a plurality of $SiO_2/HfO_2$ layers. In some implementations, a first reflectivity of the first reflector layer is greater than a second reflectivity of the second reflector layer.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:
1. A light emitting diode (LED) structure, comprising:
   a substrate;
   a LED unit formed on the substrate, comprising:
      a passivation layer, and
      an electrode layer formed on the passivation layer;
   a first reflector layer formed between the substrate and the LED unit; and
   a second reflector layer formed on the LED unit,
   wherein a common anode layer of the LED unit is formed on the first reflector layer;
   wherein the first reflector layer, the LED unit and the second reflector layer are configured to collectively provide a resonant cavity; and
   wherein the second reflector layer is formed on the passivation layer and the electrode layer.
2. The LED structure of claim 1, wherein a first reflectivity of the first reflector layer is greater than a second reflectivity of the second reflector layer, and a light emitted by the LED unit exits the LED structure from the second reflector layer.

3. The LED structure of claim 1, wherein the second reflector layer is a distributed Bragg reflector (DBR).

4. The LED structure of claim 3, wherein the DBR comprises a plurality of $TiO_2/SiO_2$ layers or a plurality of $SiO_2/HfO_2$ layers.

5. The LED structure of claim 1, wherein the LED unit comprises:
a first doping type semiconductor layer formed on the first reflector layer;
a multiple quantum well (MQW) layer formed on the first doping type semiconductor layer; and
a second doping type semiconductor layer formed on the MQW layer, wherein the second doping type semiconductor layer comprises an isolation material made through implantation, and the isolation material divides the second doping type semiconductor layer into a plurality of LED mesas,
wherein a first refractive index of the isolation material is lower than a second refractive index of the LED mesas.

6. The LED structure of claim 5, wherein the first reflector layer is a first doping type ohmic contact layer.

7. The LED structure of claim 5, wherein
the passivation layer is formed on the second doping type semiconductor layer, the electrode layer is in contact with a portion of the second doping type semiconductor layer through an opening on the passivation layer, and an aperture of the LED mesas is smaller than the opening on the passivation layer.

8. The LED structure of claim 5, wherein the second doping type semiconductor layer is surrounded by the isolation material.

9. A light emitting diode (LED) structure, comprising:
a substrate;
a first reflector layer formed on the substrate;
an optical cavity structure formed on the first reflector layer; and
a second reflector layer formed on the optical cavity structure,
wherein the optical cavity structure is formed by at least one LED unit surrounded by an ion-implanted material; and
the LED unit comprising a passivation layer and an electrode layer formed on the passivation layer; and
wherein the second reflector layer is formed on the passivation layer and the electrode layer.

10. The LED structure of claim 9, wherein the second reflector layer is a distributed Bragg reflector (DBR).

11. The LED structure of claim 10, wherein the DBR comprises a plurality of $TiO_2/SiO_2$ layers or a plurality of $SiO_2/HfO_2$ layers.

12. The LED structure of claim 9, wherein a first reflectivity of the first reflector layer is greater than a second reflectivity of the second reflector layer.

13. The LED structure of claim 9, wherein the LED unit comprises:
a first doping type semiconductor layer formed on the first reflector layer;
a multiple quantum well (MQW) layer formed on the first doping type semiconductor layer; and
a second doping type semiconductor layer formed on the MQW layer, wherein the second doping type semiconductor layer comprises an isolation material made through implantation, and the isolation material divides the second doping type semiconductor layer into a plurality of LED mesas,
wherein a first refractive index of the isolation material is lower than a second refractive index of the LED mesas.

14. The LED structure of claim 13, wherein the first reflector layer is a first doping type ohmic contact layer.

15. The LED structure of claim 13, wherein:
the passivation layer is formed on the second doping type semiconductor layer; and
the electrode layer is in contact with a portion of the second doping type semiconductor layer through an opening on the passivation layer,
wherein an aperture of the LED mesas is smaller than the opening on the passivation layer.

16. The LED structure of claim 13, wherein the second doping type semiconductor layer is surrounded by the isolation material.

* * * * *